United States Patent [19]

Henley et al.

[11] Patent Number: 5,095,262
[45] Date of Patent: Mar. 10, 1992

[54] ELECTRO-OPTIC SAMPLING SYSTEM CLOCK AND STIMULUS PATTERN GENERATOR

[75] Inventors: Francois J. Henley, San Jose; Dean J. Kratzer, Palo Alto, both of Calif.

[73] Assignee: Photon Dynamics, Inc., San Jose, Calif.

[21] Appl. No.: 240,017

[22] Filed: Sep. 1, 1988

[51] Int. Cl.⁵ .............................................. G01R 31/00
[52] U.S. Cl. ................................. 324/73.1; 324/158 R; 371/27
[58] Field of Search .............. 324/73 R, 158 R, 77 K, 324/96; 371/27, 22.4, 22.6, 15.1; 356/364, 365; 328/16, 17, 18, 19

[56] References Cited

U.S. PATENT DOCUMENTS

| | | | |
|---|---|---|---|
| 2,451,480 | 10/1948 | Edson et al. | 328/16 |
| 3,436,651 | 4/1969 | Helms et al. | 324/96 |
| 3,512,092 | 5/1970 | Thurnell | 328/16 |
| 3,582,812 | 6/1971 | Kochi | 328/16 |
| 3,701,027 | 10/1972 | Belton, Jr. | 328/17 |
| 4,381,461 | 4/1983 | Steensma | 328/18 |
| 4,446,425 | 5/1984 | Valdmanis et al. | 324/77 K |
| 4,618,819 | 10/1986 | Mourou et al. | 324/77 K |
| 4,681,449 | 7/1987 | Bloom et al. | 324/77 K |
| 4,862,075 | 8/1989 | Choi et al. | 324/158 R |
| 4,875,006 | 10/1989 | Henley et al. | 324/158 R |

Primary Examiner—Kenneth A. Wieder
Assistant Examiner—Vinh P. Nguyen
Attorney, Agent, or Firm—Flehr, Hohbach, Test, Albritton & Herbert

[57] ABSTRACT

A high-speed electro-optic test system for testing high-speed electronic devices and integrated circuits is provided with a precision programmable reference clock source providing clock pulses for accurately timing a stimulus pattern in precise synchronism with optical sampling pulses. The clock source includes a frequency synthesizer having a programmed output frequency and precision delay features. The stimulus pattern clock frequency and pattern length can be programmed to facilitate maximum throughput for devices being tested in the electro-optic system.

24 Claims, 6 Drawing Sheets

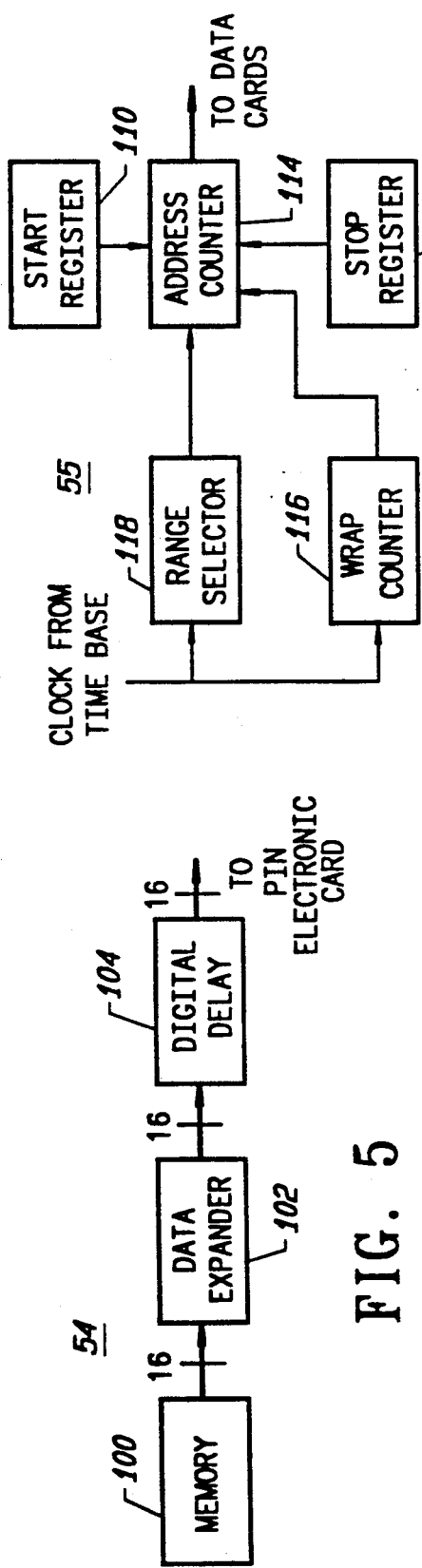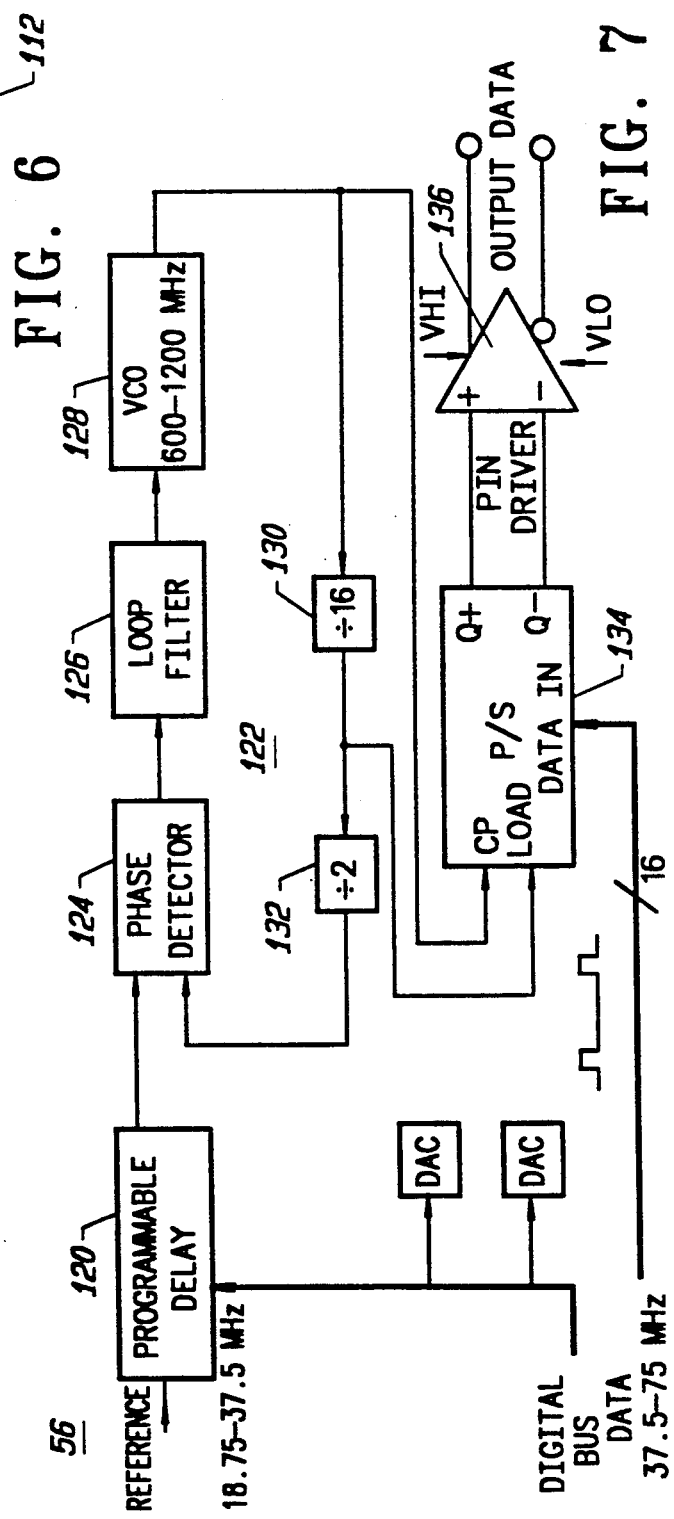

ELECTRO-OPTIC SAMPLING SYSTEM CLOCK AND STIMULUS PATTERN GENERATOR

CROSS-REFERENCE TO RELATED APPLICATIONS

This application relates to:

ULTRA-HIGH SPEED DIGITAL TEST SYSTEM USING ELECTRO-OPTIC SIGNAL SAMPLING: A-46995; inventors Francois G. Henley, et al.; Ser. No. 239,577 filed Sept. 1, 1988; U.S. Pat. No. 4,875,006 issued Oct. 17, 1989.

HIGH FREQUENCY TEST HEAD USING ELECTRO-OPTICS: A-46998; inventors Hee-June Choi, et al.; Ser. No. 240,016 filed Sept. 1, 1988; U.S. Pat. No. 4,862,075 issued Aug. 29, 1989.

ELECTRO-OPTIC SAMPLING SYSTEM WITH INDIVIDUAL PULSE MEASUREMENT AND VOLTAGE CALIBRATION: A-46999, assigned to the assignee of the present invention and hereby incorporated by reference. Inventor Francois G. Henley, Ser. No. 239,585 filed Sept. 1, 1988, now abandoned.

BACKGROUND OF THE INVENTION

1. Field of the Invention

This invention relates to synchronizing and timing systems, and, more particularly, to synchronizing and timing systems for high speed testing of electronic circuits by electro-optical test systems.

2. Prior Art

Increased speeds provided by improvements in integrated circuits and devices using emitter-coupled logic ECL, gallium arsenide, and complementary-MOS technologies has created a need for production-testing and circuit-characterization test equipment which can test integrated circuits and devices operating in excess of 200 MHz. A test system operating above 1 gigaHz, discussed in the copending patent application incorporated herein by reference, generates electronic stimulus test vectors having a NRZ data rate of 1.2 Gb/s and uses an electro-optic effect, the Pockels effect, to measure the input and output signals of a device under test DUT.

Various techniques are available in the prior art for synchronizing and timing electro-optic test systems.

One technique uses an optical sampling pulse both as the timing reference for the generation of electronic test signals and as the optical sampling pulse for measurement of the resultant electronic signals. U.S. Pat. No. 4,446,425 to Valdmanis et al. and U.S. Pat. No. 4,681,449 to Bloom et al. each describe systems which use light pulses from a laser source to optically generate electronic pulses from photodiodes. The pulses are then coupled directly to a Pockels cell. Phasing, or delay, of an electronic pulse with respect to a light pulse is accomplished by mechanical variation of the optical path travelled by a light pulse prior to its impinging upon a photodiode. Such mechanical variations makes scanning measurements very slow and subject to misalignment of precision optical paths.

Another technique locks a laser to a frequency synthesizer. The frequency synthesizer is used as the time base for generation of electronic stimulus signals The synthesizer is tuned to a harmonic frequency of the optical pulse repetition frequency plus a small offset frequency. Consequently, the laser pulse applied to the electro-optical detector appears to slowly scan the repeating electronic signal as a sequential sampling pulse. This technique has several drawbacks. The stimulus signal frequency is constrained to be at or very near a harmonic frequency of the laser pulse repetition frequency, which severely limits the frequency resolution range of such a system. Such a system can only operate in a sampling mode and an optical pulse cannot be rapidly positioned on a repeating stimulus signal.

SUMMARY OF THE INVENTION

It is therefore an object of the invention to provide an improved timing and synchronization system for a high-speed electro-optical test system.

It is another object of the invention to provide a timing and synchronization system which can accurately and rapidly position an optical sampling pulse at any point of a repeating stimulus waveform.

It is another object of the invention to provide an improved timing and synchronization system for a high-speed electro-optic test system by using optical sampling pulses as the time reference signals for generation of stimulus signals.

It is another object of the invention to provide an improved way of distributing timing and synchronization signals to a high-speed electro-optic test system.

It is another object of the invention to provide a high-speed electro-optic test system which can test using either a sequential sampling mode for waveform mapping or a quasi-random sampling mode for functional testing.

It is another object of the invention to provide a high-speed electro-optic test system which is frequency agile and which provides good frequency resolution.

It is another object of the invention to provide a high-speed electro-optic test system which locks the frequency of the laser pulse to the frequency of a rep[eating stimulus signal].

It is another object of the invention to provide a high-speed electro-optic test system which improves the rate at which electronic devices can be tested.

In accordance with these and other object of the invention, a programmable reference clock generator is provided for triggering a stimulus pattern generator which provides signals for electronically testing a device under test DUT in an electro-optic test system using an optical sampling pulse. The reference clock generator includes a source of reference pulses. These pulses may be either derived from a optical pulse source or may be the reference pulses for triggering a source of light pulses. Stimulus clock signals are synthesized from the electronic reference pulses and the synthesizer is programmed to frequency-lock its output to a harmonic frequency of the electronic reference pulse rate. The occurrence of clock signals can be varied with respect to the optical sampling pulses. According to one aspect of the invention, the synthesizer may be a phase-locked loop having a programmable divider. The output of the phase-locked loop can be delayed, for example, in a pulse swallow/expel counter to provide clock signals delayed or advanced in phase with respect to a nominal output signal and with respect to an optical sampling pulse.

According to another aspect of the invention, an electronic stimulus pattern generator for a high speed electro-optic test system is provided which includes means for generating a time-base clock as described hereinabove and a means for generating a stimulus pattern in synchronism with the clocks such that the stimulus pattern is synchronized with optical sampling pulses for the system. Patterns are generated in a parallel mode at the reference clock rate and converted to a serial mode by multiplication of the clock signal in a pin electronics circuit located adjacent to the pins of an electronic device under test. According to a further aspect of the invention, the stimulus pattern generator described hereinabove further includes means for repeating a predetermined stimulus pattern having a desired length, such that all the bits of the stimulus pattern are sampled by optical sampling pulses. The divisor N in the feedback path phase-locked loop is required to be an odd integer and is determined by calculating the ratio between a desired stimulus clock frequency and the optical pulse repetition rate.

BRIEF DESCRIPTION OF THE DRAWINGS

The accompanying drawings, which are incorporated and form a part of this specification, illustrate embodiments of the invention and, together with the description, serve to explain the principles of the invention:

FIG. 5 is block diagram of a data card according to the invention.

FIG. 6 is a block diagram of an address card according to the invention.

FIG. 7 is a block diagram of a pin electronics circuit card according to the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
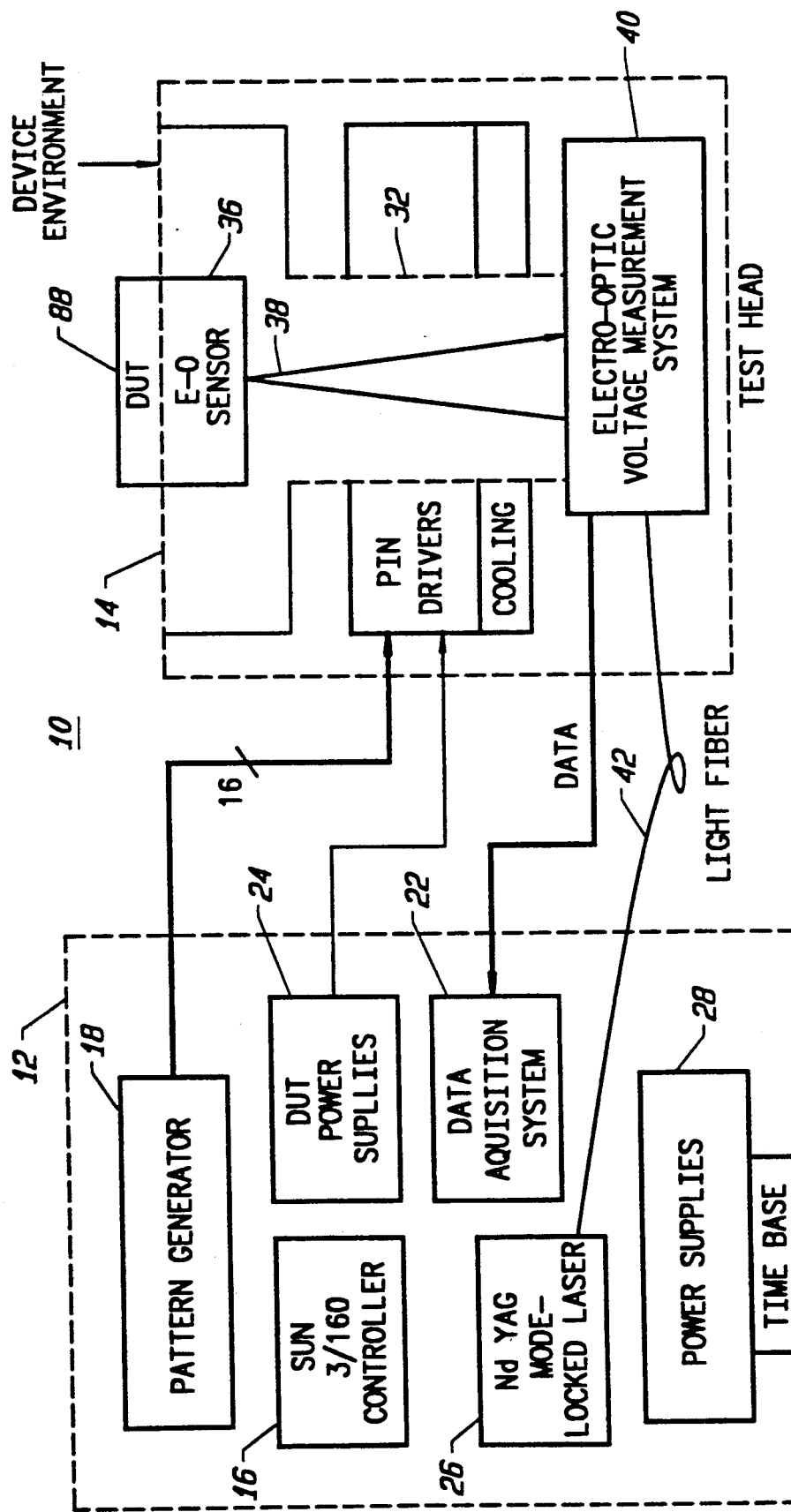
FIG. 1 is a system block diagram for an electro-optic test system for high-speed testing of electronic devices and integrated circuits.

FIG. 1 of the drawings shows a block diagram of an electro-optic test system 10 including a main system unit 12, housed in a rack enclosure, and a test head unit 14.

The main system unit 12 contains a SUN 3/160 CPU system controller 16, an ECL stimulus pattern generator 18, a programmable system time base generator 53, a data acquisition system 22 including a sampling controller, programmable power supplies 24 for a device under test DUT, a mode-locked Nd:YAG laser 26 as an optical sampling source, and other support electronics including system power supplies 28.

The test head unit 14 contains a number of high speed pin electronics PE driver 30 circuits, one for each pin of a device under test. These circuits are radially mounted around a centrally-located tubular support structure 32. A device under test DUT 88 is mounted on a controlled impedance platform at the top end of the tubular support structure 32. Stimulus signals, power, and responses are coupled between individual pins of a DUT 88 and a pin electronics circuit driver 30 board by conductors (not shown). The input/output pins of a DUT 88 are coupled to a Pockels cell electro-optical sensor 36. The sensor 36 is optically sampled by a laser pulse, the path of which is shown by ray 38. An electro-optic scanning and measurement system 40 receives light pulses on a fiber optic conductor 42 from the laser source 26.

Stimulus test data from the pattern generator 18 is transmitted to each of the PE circuit boards 56 in the test head in parallel form in a 16-bit wide ECL format. This data is multiplexed to a serial form in the test head for stimulation of the DUT 88 at a frequency which is 16 times higher.

Figure 2:
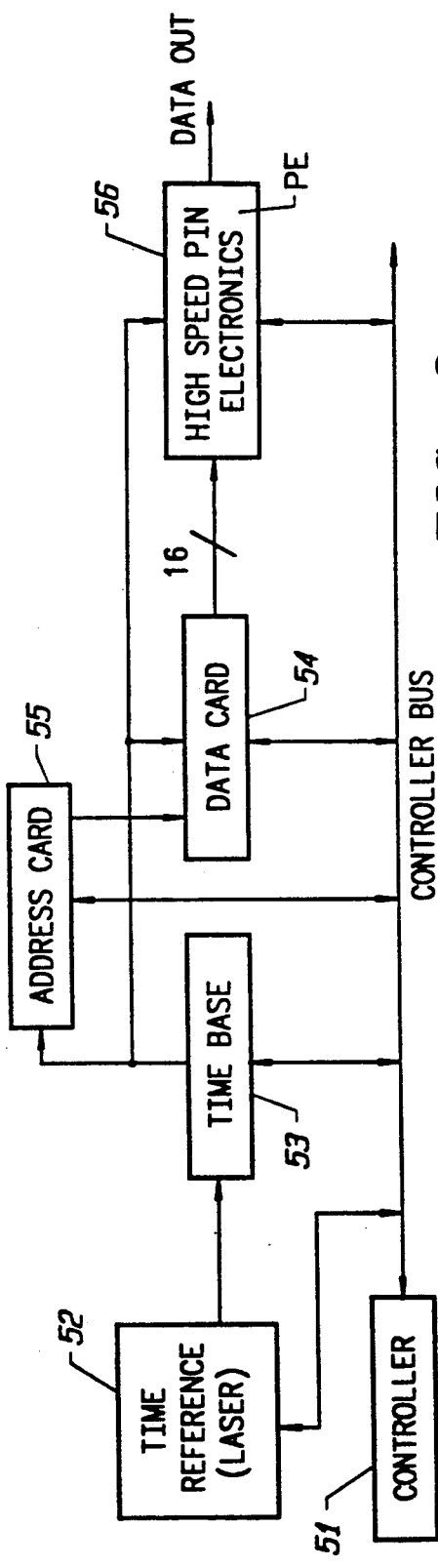
FIG. 2 is a schematic block diagram of a 1.2 GHz stimulation test, pattern generator according to the invention.

FIG. 2 is a block diagram of a 1.2 GHz pattern generator system 50 having a number of subsystem elements. A system controller 51 controls all the functions of the system by means of a CONTROLLER BUS as shown. A time reference subsystem 52 derives a system time-reference pulse, for example, from very stable laser pulses emitted from the laser pulse source 26 of FIG. 1. Since the laser pulses also serve as a source of optical sampling pulses for the electro-optical sensor 36, the entire system can be synchronized so that stimulus data patterns and response measurements are synchronized in time with optical samples.

A time base system 53 provides common timing information to all of the PE circuit cards 56. The timing of the entire test system is locked to the stable laser pulses, which cannot be easily varied. The optical sampling rate is limited to 1 MHz because of performance limitations of the electro-optic voltage measurement system 40. Consequently, the stimulus patterns, which run in some cases at over 1 GHz clock rates, must be varied such that each bit of a stimulus pattern can be sampled by the optical sampling pulse running at 1 MHz. Therefore, some scheme is necessary to scan a stimulus pattern in what can be referred to as a quasi-random pattern. The time base system 53 permits the timing of the stimulus pattern generator 18 to be moved relative to the laser sampling pulse so that the laser pulse can sample the entire stimulus pattern of up to 32k bits in an efficient quasi-random manner. The time base system 53 also provides the clock pulses necessary for operation of a data card 54 and an address card 55 for the data card. The combination of the data card 54, address card 55, and the high speed pin electronics 56 form a means for generating stimulus patterns for the device under test (DUT). As discussed hereinbelow, in an embodiment of the time base system 53, a phase-locked loop synthesizer is referenced to an electronic reference signal obtained by photo-detection of the optical sampling laser pulses.

Each of a number of high-speed pin electronics PE circuit cards 56 contains circuitry for one high-speed channel associated with one terminal pin of a DUT. The overall function of a PE card is to receive a 16-bit wide data stream at a 37.5 to 75 MHz clock rate from an associated data card 54 and to transmit that data at rates of up to 1200 MB/s to a pin of a DUT. In one embodiment of the invention, 20 pins of a DUT can be stimulated with each pin having an associated data card 54 and PE card.

Figure 3:
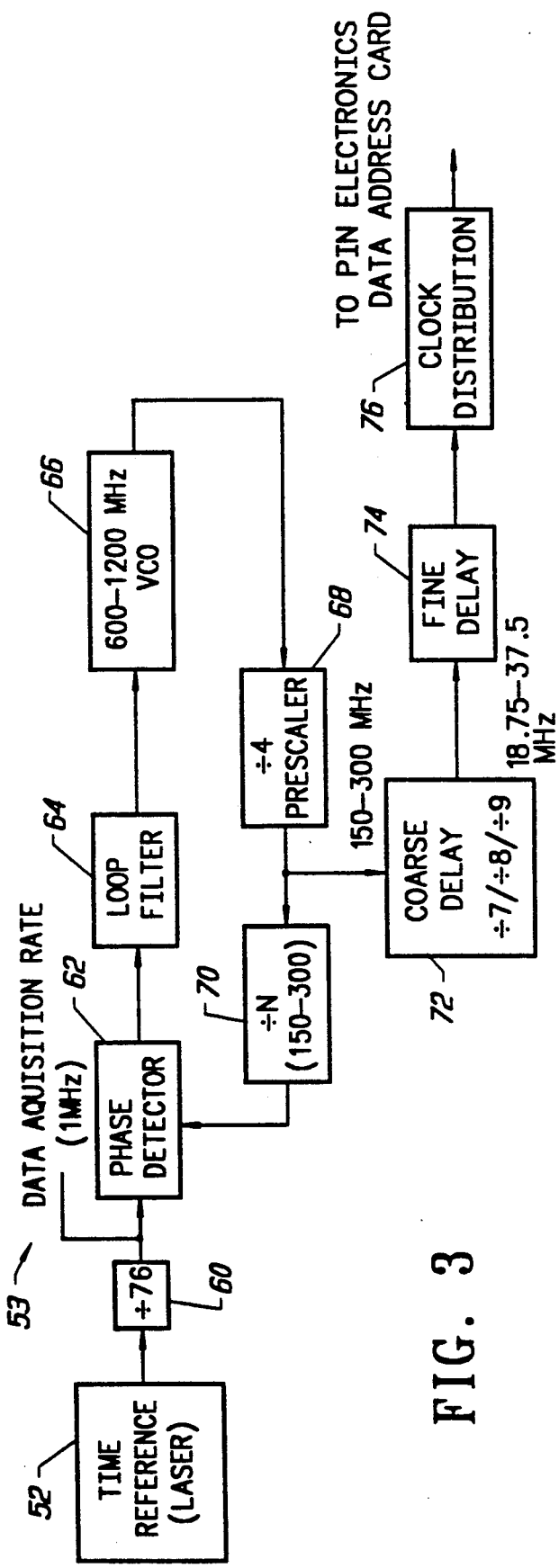
FIG. 3 is a block diagram of the programmable reference clock generator according to the invention.

FIG. 3 shows a block diagram of a time base generator system, corresponding to the time base generator 53 of FIG. 2, being supplied with time reference clock pulses from a laser pulse source 26 operating at a pulse repetition frequency of 76 MHz. which is detected to provide an electronic reference pulse. A reference divider circuit 40 divides the 76 MHz pulse repetition rate of the electronic reference pulses down to a 1 MHz signal. This signal is the reference frequency for a programmable phase-locked loop which includes a phase detector 62 which has one input coupled to the 1 MHz reference signal. The output error signal from the phase-detector 62 is fed through a low pass loop filter 64 to the voltage control input terminal of a voltage-controlled oscillator VCO 66 which operates over a range of 600 to 1200 MHz. The output signal of the VCO is first divided by 4 in the prescaler circuit 68. The signal is then divided in a programmable divide-by-N circuit 70, where N ranges from 150 to 300, and fed to the second input of the phase detector 62.

The output of the prescaler 68 is also coupled to a course delay counter 72 which normally divides by 8 and which can be switched to divide by either 7 or by 9. The effect of using the divide by 7 or by 9 is that the signal at the output of the coarse delay circuit 72 will lead or lag the reference laser sampling pulse. Time delays less than one sampling pulse period are obtained by a fine delay circuit 74 connected to the output of the coarse delay circuit 72. The fine delay circuit 74 is a digitally controlled L-C transmission delay line in which the C's are voltage-tuned varactors and which has a delay range of 7 nsecs. Using a combination of coarse and fine delays any relative phasing between the output clock of the time base subsystem 53 can be obtained. The output of the time base subsystem 53 is at a frequency between 18.75 and 37.5 MHz which can easily be distributed through a clock distribution network 76 to the pin electronic circuits and to the data and address circuit cards.

The performance parameters of the time base system 53 are frequency resolution of less than 1%, residual time jitter of less than 5 psec, and minimum fine delay range of 6.6 nsec. with resolution less than 10 psec.

The divide-by-4 prescaler 68 was used because of the difficulty encountered in designing and operating a programmable counter having an input frequency of 600 to 1200 MHz and in which tolerances in propagation delays approach one input pulse period. A prescaler was selected to insure performance which required no calibration adjustments.

To reduce settling time of a pattern generator when the timing is changed, the coarse and the fine delay circuits were located outside the phase-locked loop. The coarse delay circuit 72 is a divide-by-8 pulse swallow/expel counter which can be programmed to divide by 9 or 7. Pulse-swallow operation results in sampling 4 VCO clock cycles early and pulse-expelling results in sampling 4 VCO clock cycles later in a stimulus pattern. The maximum delay range is then 6.67 nsec, or four 600 MHx clock cycles. To interpolate within this range the fine delay circuit provides 4096 quantized delay steps over a range of about 7 nsec. by using a L-C lumped transmission line structure with C being a voltage-tuned varactor.

Figure 4:
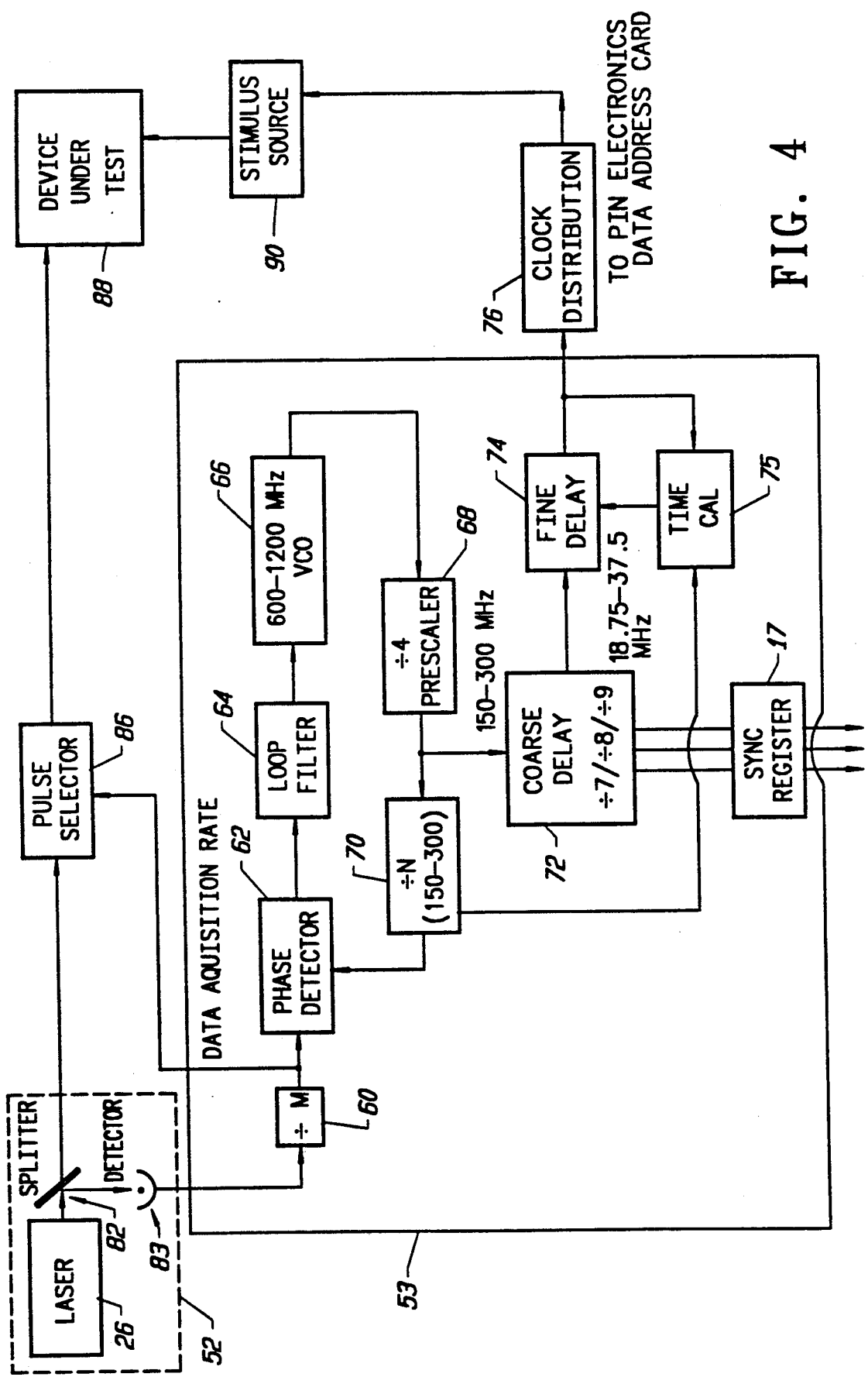
FIG. 4 is a schematic block diagram of an electro-optic test system using a stimulus pattern generator and a programmable reference clock generator according to the invention.

FIG. 4 is a block diagram of an electro-optic test system showing some of the subsystems shown in FIG. 1 and the time base generator 53 shown in FIG. 3. In this embodiment, the system optical sampling source is a mode-locked YAG laser 26 which generates a series of light pulses at a constant repetition rate, for example, approximately 76 MHz. The light output of the laser is split by a beam splitter 82. One beam is incident on a fast photodetector 83, the electronic signal output of which drives a counter 60. The counter output provides a phase reference signal for the phase-locked loop. The output of the counter 60 is also used as a timing signal for an optical pulse selector 86, which gates the optical output pulses of the laser 26 and passes only those optical pulses which are time coincident with the output pulses of the counter 60. Those optical pulses which pass become the optical sampling pulses for sampling a DUT as indicated by reference numeral 88.

The coarse delay circuit 72 and the fine delay circuit 74 permit the clock pulses for particular stimulus pattern bits to be advanced or retarded with respect to an optical sampling pulse. Calibration of the fine delay circuit 74 is accomplished by a time calibration circuit 75 which compares the reference input signal, the output of the variable counter 70, with the output of the fine delay circuit 74 to calibrate the full scale delay of the fine delay.

FIG. 4 also shows the clock distribution system 76 feeding signals to a stimulus pattern source 90 for presenting stimulus pulses to the DUT 88 at appropriate times for sampling in the electro-optical cell by the optical sampling pulses. The stimulus pattern source 90, generally known as means for generating stimulus patterns, is the combination of the address card 55, the data card 54, and the high speed pin electronics 56 of FIG. 2.

FIG. 5 shows a data card 54 block diagram having a RAM memory 100 holding 32k test vectors, or test bits. The output of a data card is a 16-bit wide differential ECL data stream. The data rate of the data card 54 is 600–1200 Mb/s. To obtain lower data rates, the data expander circuit 102 repeats data bits such that the maximum test vector length of 32k is preserved independently of data rate. To obtain a delay range of plus or minus one data cycle over the complete range of clock frequencies, that is, over a range of 75 to 1200 MHz, a digital delay 104 is provided in the data card 54 for large delays and an analog delay is provided in the PE cards for small delays, as required.

FIG. 6 shows a diagram of an address card 55, the primary function of which is to provide address information to the data card RAM memories. The start register 110 selects the starting data initially presented to the data card. The stop register 112 determines the final count of an address counter 114. The stop address is continuously presented to the data card memories until a wrap counter output terminal counts. To allow test vector rates less than 600–1200 MHz, the range counter 118 reduces the clock pulse rate at the input to the address counter 114 by a factor of 2 for each octave reduction in data rate. The address counter constrains the test vector length to be:

$$TVL = 16 \cdot x$$

where x is an integer.

FIG. 7 shows a block diagram for a pin electronics PE circuit card 56. The exemplary system test head 14 as shown in FIG. 1 contains 20 such circuit cards, each of which contains circuits for one high-speed channel. The overall function of a PE card is to receive a 16-bit wide parallel data stream at 37.5-75 MHz from the data cards and to accurately deliver a serial output data stream at rates up to 1200 MHz to a DUT on the test head.

The timing control portion of the PE card includes a digitally-controlled time delay circuit 120 and a phase-locked loop 122. A reference clock signal at 18.75-37.5 MHz is one input of a phase-detector circuit, the output of which is filtered in the low pass filter circuit 126 and applied to the control terminal of VCO 128 to control its frequency over a range of 600-1200 MHz. The VCO output frequency is divided by 16 in divider circuit 130 and by 2 in divider circuit 132. The VCO output signal divided by 32 is then fed to the other input of the phase detector 124 so that the VCO output frequency is 32 times the reference input frequency.

The data path through the PE card is via a 16-bit parallel-to-serial shift register 134 to a pin driver 136. Parallel data, 16 bits wide, from the data cards located in the main system unit 12 of FIG. 1 is supplied to the parallel inputs of the shift register 134. The Q+ and Q− serial outputs of the shift register 134 provide high-speed data to the differential inputs of the pin driver 136. The VCO output signal at 600-1200 MHZ drives the clock input of the shift register 134, while the divide-by-16 output signal drives the load input terminal of the shift register. The shift register operates such that in each group of 16 clock pulses, one parallel load operation takes place and is followed by 15 shifts of data to the output. While the serial shifting is occurring, the data card is providing the next 16 bits of data to the parallel inputs of the shift register 134. Use of a shift register for parallel to serial conversion permits the maximum data rate to the PE card to be 75 MHz. For 20 PE channels, the number of stimulus data bits passing from the data card to the test head is 320 bits, each at a rate of 37.5 to 75 Mhz. Signals at these data rates can easily be handled by relatively inexpensive cables and integrated circuits.

The characteristics of the phase-locked loop in a PE have an effect on the performance of a test system. The loop functions, in effect, as a filter for perturbations close to the VCO output signal. The following considerations were made when this design was made: Any modulation, noise, or jitter at the VCO output is directly transferred to the data at the output of the PE card because the VCO output transfers data to the pin drivers. The phase-locked loop filter must reduce the reference signal fed through the output of the phase detector to a level low enough to not contribute to jitter of the VCO output signal. The VCO free running phase noise must be sufficiently suppressed by the phase-locked loop. The phase-locked loop filter should substantially reduce any jitter on the output data when any noise appears on the reference clock signal supplied to each PE card. The transition times of the logic elements should be as low as possible because GaAs logic is used. The settling time of the phase-locked loop after an input frequency or phase change is made affects the execution time of a test program. The phase-locked loop should be relatively insensitive to temperature and power supply variations.

SAMPLING METHODOLOGY (Wave Conditions)

The electro-optic receiver of the test system places constraints on stimulus pattern length if maximum throughput is required The test system operates in two functional modes.

The first mode function is as a logic analyzer; the second mode is as a sampling scope in which the tester performs sequential sampling. In the logic analyzer mode, subsets of the DUT responses are collected each pass of the test pattern; the response vectors are not acquired sequentially and time base delay setting must be changed in order to collect all response vectors.

Sequential sampling collects samples sequentially in time position but requires many more passes of the pattern to complete data acquisition of the selected time window.

LOGIC ANALYZER MODE

The tester architecture is such that the data rate is always an integer multiple of the optical sampling rate of the receiver. This forces sampling of information to occur in the same relative time position on each test, or cell. The number of test vectors between samples is given by equation 2 and is referred to as the initial interleave factor, IFi.

$$IFi = \frac{Ts}{Td} = \frac{Fd}{Fs} = \frac{Fl * 4 * N/(M)}{Fl/M} = 4 * N \qquad (2)$$

where:
Ts = Time between vector sampling
Td = Vector period
Fd = Data rate
Fs = Response sampling rate
Fl = Laser repetition rate
N = Time base PLL divider setting
M = Reference divider ratio The initial interleave factor is the number of test vectors between sampled vectors occurring from one pass of the test vector applied to the DUT. On the first iteration of a stimulus test sequence, a sample will occur every IFi vectors. If the pattern length given by equation 3 is not an integer multiple of the initial interleave factor, on the second pass of the test vector pattern the samples will fall on a different subset of test vectors.

$$TVL = 16 * x \qquad (3)$$

TVL = pattern length
x = integer

This iterative sampling process continues until the first vector of the first subset is sampled twice. The spacings between sampled vectors after the first vector in the first subset is sampled twice is referred to as the final interleave factor, IFf. The final interleave factor is the highest common factor of the initial interleave factor and the pattern length. To collect the remaining data requires the delay elements of the time base be varied; the required number of changes in delay setting is one less than the final interleave number. The movement of the time base delay results in a phase perturbation to the reference input of the PLLs in the pin electronic cards. The settling time of the PLL to within 5 ps results in loss of sample data during this period. The algorithm to minimize the final interleave number is given below:

1) N is calculated using equation 4 and then rounded to the nearest odd integer, because test vector length is always even. This results in actual test frequency to be within 0.5% of desired test frequency.

$$N = \frac{Fd \cdot m}{Fl \cdot 4} \quad (4)$$

where:
Fd = Desired data rate
Fl = Laser repetition rate
M = Reference divider ratio 2) Xi is calculated using equation 5

$$Xi = \frac{TVL}{16} \quad (5)$$

where:
TVL = Test pattern length

3) The test pattern length is increased by the addition of no-ops to a length given by equation 3; where X is the least odd number greater than Xi which contains no common factors with N.

Figure 8:
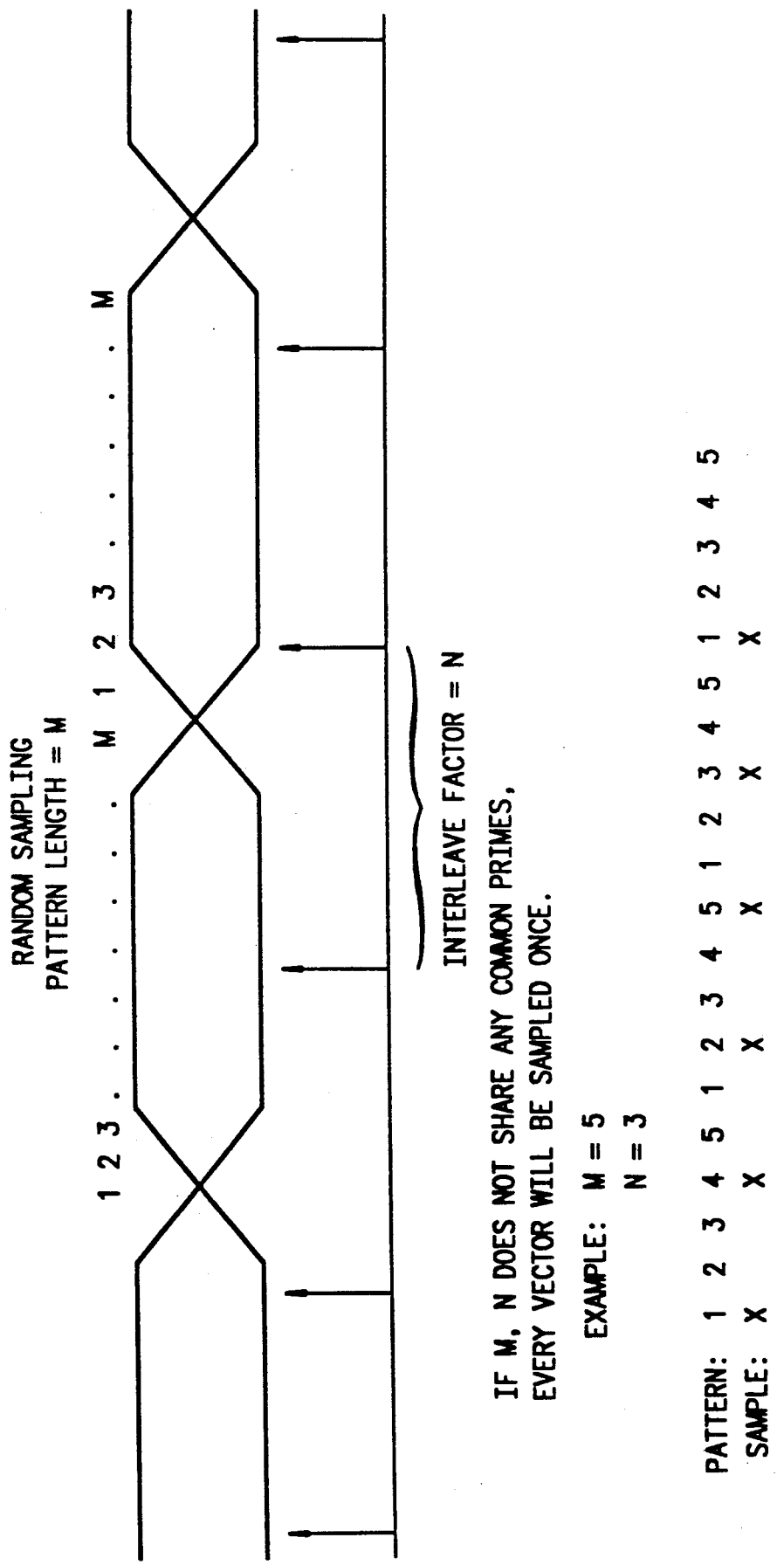
FIG. 8 is a waveform diagram showing an example of the quasi-random optical sampling of a stimulus pattern according to the invention.

FIG. 8 shows a simple example of quasi-random sampling.

SAMPLING MODE

The tester is operated in a sequential sampling mode if propagation delay, edge rate or other timing information is required. This mode of operation places different constraints on pattern length if tester throughput is to be maximized. The shortest test time requires the minimum number of passes of the test vector to collect the required information. Signal averaging can be used to achieve greater voltage resolution if single shot resolution is insufficient for the user. If averaging is utilized, the pattern length should be such that every pass of the test pattern results in sampling the same point of the repeating test vector. The algorithm to minimize test time is given below:

1. N is calculated using equation 4 and rounded to the next even integer to achieve data rate within 0.5% of the desired data rate.
2. Xi is calculated using equation 5.
3. Xi is rounded to the next even integer and L is calculated using equation 6

$$L = \frac{16 \cdot Xi}{N} \quad (6)$$

4. Xi is increased in integer steps until L is an integer.
5. The pattern is then padded by use of the wrap counter of the address card or padded with no-ops to achieve a pattern length given by equation 7.

$$\text{Pattern length} = 16 \cdot Xi \quad (7)$$

Figure 9:
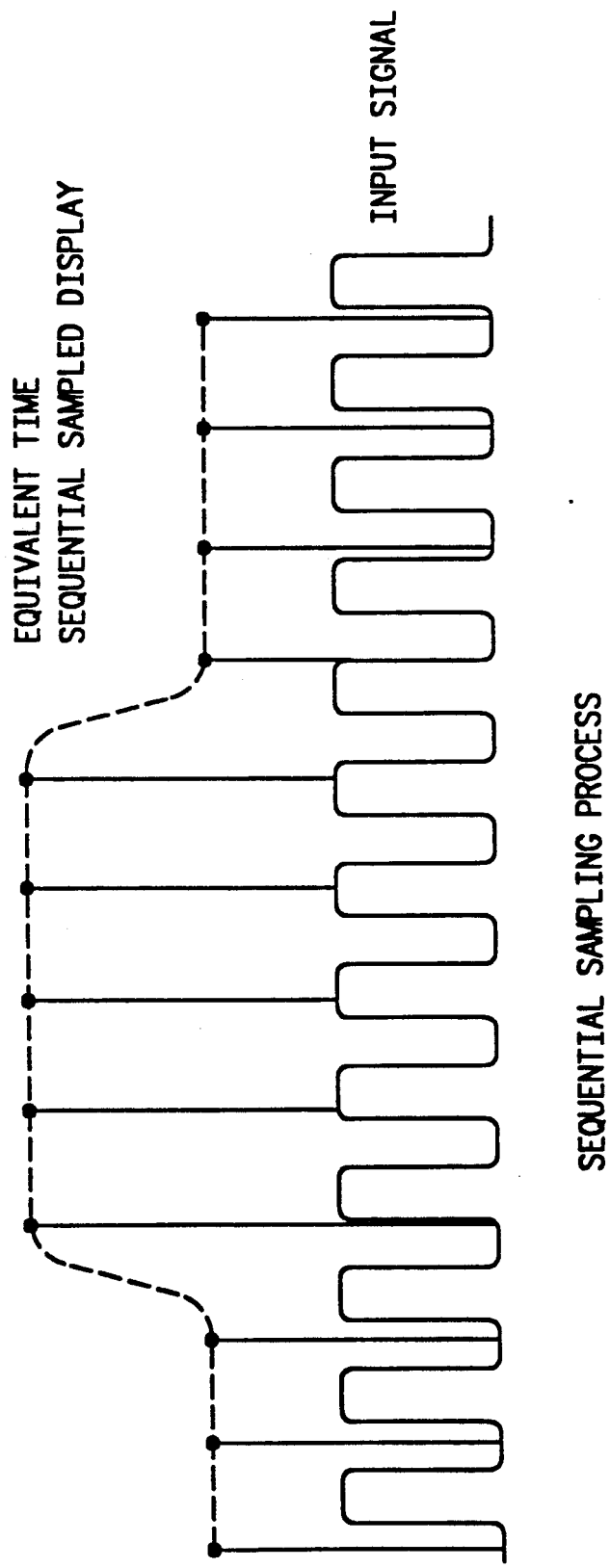
FIG. 9 is a waveform diagram showing an example of sequential sampling of a stimulus pulse according to the invention.

FIG. 9 shows an input signal to an electron optic test system being sequentially sampled.

The foregoing description of the preferred embodiments of the invention have been presented for purposes of illustration and description. It is not intended to be exhaustive or to limit the invention to the precise forms disclosed and many modifications and variations are possible in light of the above teachings. The preferred embodiments have been chosen and described in order to best describe the principles of the invention, and its practical applications, to thereby enable others skilled in the art to best utilize the invention and various embodiments with various modifications as are suited to the particular use contemplated. It is intended that the scope of the invention by defined by the claims appended hereto.

We claim:

1. Apparatus for generating stimulus patterns in an electro-optic test system comprising:
   a source of electronic reference pulses (52) having a pulse repetition frequency;
   means for synthesizing (53) a synthesized stimulus reference clock signal from said electronic reference pulses which is frequency-locked to a subharmonic frequency of the pulse repetition frequency of said electronic reference pulses; and
   an electronic stimulus pattern generator for generating a stimulus test pattern, said electronic stimulus test pattern generator having a clock input,
   means for distributing (76) said synthesized stimulus reference clock signal to said clock input of said electronic stimulus pattern generator (90).

2. The apparatus of claim 1 wherein said source of electronic reference pulses includes a source of optical pulses, means for converting said optical pulses to said electronic reference pulses (83) and means for supplying said optical pulses to said electro-optical test system to serve as optical sampling pulses.

3. The apparatus of claim 1 wherein the means for synthesizing (53) a synthesized stimulus reference clock signal said a source of electronic reference pulses includes means for generating optical sampling pulses (82 and 86) coupled to said electro-optical test system whereby said electronic reference pulses serve as a timing reference for said optical sampling pulses and said synthesized stimulus reference clock signal.

4. The apparatus of claim 1 wherein the means for synthesizing (53) a synthesized stimulus reference clock signal includes means for controlling (70, 72 and 74) the occurrence of said synthesized stimulus reference clock signal with respect to the electronic reference pulses.

5. The apparatus of claim 1 wherein the means for synthesizing (53) a synthesized stimulus reference clock includes a phase-locked loop having:
   a phase-detector (62) with a first input terminal coupled to said electronic reference pulses;
   a loop filter (64) having its input terminal coupled to the output signal of said phase-detector;
   a controlled-oscillator (66) having its control terminal coupled to the output signal of said loop filter;
   a programmable frequency divider (70) having its input terminal coupled to the output signal of the controlled oscillator and having its output signal coupled to a second input terminal of said phase detector;
   whereby the frequency of the output signal of the controlled oscillator is locked to a multiple of the frequency of the electronic reference pulses.

6. The apparatus of claim 5 including a prescale frequency divider (68) having its input terminal coupled to the output signal of the controlled oscillator.

7. The apparatus of claim 5 including means coupled to the output of the controlled oscillator for programmably delaying (72, and 74) the output signal of said phase-locked loop.

8. The apparatus of claim 7 wherein said means for delaying includes a frequency divider (70) having pulse swallowing and expelling capabilities which provides an output signal delayed or advanced in phase from a nominal output signal.

9. The apparatus of claim 7 wherein said means for delaying includes digitally controlled means for providing fine delay (74) in the output signal.

10. The apparatus of claim 9 including means for calibrating (75) the fine delay by comparing a full-scale fine delay to a predetermined coarse delay.

11. A high-speed electronic stimulus pattern generator for an electro-optic test system, comprising:
means for providing a time reference signal (52) for an optical sampling signal source and for providing a time reference signal (52) for said electronic stimulus pattern generator;
programmable time-base means for generating a clock reference signal (53) having a programmed frequency locked to said time reference signal; and
means for generating stimulus patterns (90) having an operating frequency in synchronism with said clock reference signal.

12. The pattern generator of claim 11 wherein said programmable time-base means operates at a frequency which is a sub-multiple of the operating frequency of the means for generating stimulus patterns and wherein said means for generating stimulus patterns includes frequency multiplier means for multiplying (56) the frequency of said programmable time-base means to the operating frequency of said means for generating stimulus patterns.

13. The pattern generator of claim 12 wherein the frequency-multiplier means (56) includes a phase-locked loop for multiplying (124, 126, 128, 130, and 132) the frequency of the programmable time-base means to the operating frequency of said means for generating stimulus patterns.

14. The pattern generator of claim 12 including means for converting said stimulus pattern signals to a serial mode (134) in synchronism with the operating frequency of said means for generating stimulus patterns.

15. The pattern generator of claim 14 wherein said means for converting said stimulus pattern signals to a serial mode and said frequency multiplier means are located in a pin electronics circuit module positioned adjacent to the pins of an electronic device under test.

16. The pattern generator of claim 11 wherein said means for generating stimulus patterns (90) includes:
means for storing stimulus patterns (54) as digital bit elements;
means for reading out said digital bit elements (55) of stimulus patterns stored in said storage means.

17. The pattern generator of claim 16 wherein said means for storing stimulus patterns further includes means for providing stimulus patterns at lower rates (102) by repeating the bit elements of said stimulus patterns one or more times.

18. The pattern generator of claim 13 wherein said means for generating stimulus pattern signals includes means for delaying the output stimulus pattern signal (104) of said means for generating stimulus pattern signals.

19. The pattern generator of claim 16 including means for addressing (114) said means for storing stimulus patterns.

20. A high-speed electronic stimulus pattern generator for an electro-optic test system, said electro-optic test system including optical sampling pulses which sample electronic stimulus signals and including response signals of an electronic device under test, said electronic device under test being stimulated with a predetermined electronic stimulus pattern, comprising:
means for providing a time reference signal (52) for said optical sampling pulses having a pulse frequency;
programmable means for generating a stimulus reference clock signal (53) having a frequency which is an integer multiple of the pulse frequency of said optical sampling pulses;
means for repeatedly generating a predetermined stimulus pattern (90) in synchronism with said clock reference signal and for providing said predetermined stimulus pattern to an electronic device under test, said predetermined stimulus pattern having a length and having bits with a bit frequency which is in an integer multiple of said frequency of the optical sampling pulses.

21. The pattern generator of claim 20 wherein the predetermined stimulus pattern length and a ratio of the frequency of stimulus pattern bits to the frequency of the optical sampling pulses each contain minimum common factors.

22. The pattern generator of claim 20 wherein said programmable means for generating a stimulus reference clock signal (53) includes a phase-locked loop circuit having a programmable frequency divider (70) with a divisor N wherein N is a nearest odd integer determined by calculating a ratio between a desired bit frequency of said stimulus pattern times a reference divider ratio and the frequency of the optical sampling pulses times a scaler.

23. The pattern generator of claim 22:
wherein said length of a stimulus pattern is formed from a plurality of subsets having a fixed length;
wherein said plurality is represented by the integer X which is a least odd number greater than a ratio of the length of the stimulus pattern to said subset length;
wherein the integer X contain no common factors with N; and
wherein the length of a stimulus pattern is increased to a final length having an integer number of subsets.

24. The pattern generator of claim 20 for use with the electro-optic test system operating in a sequential sampling mode.

* * * * *